United States Patent [19]

Geil et al.

[11] 4,290,035

[45] Sep. 15, 1981

[54] MECHANICAL FILTER AND METHOD OF ACOUSTICALLY COUPLING WAVEGUIDES THEREIN

[75] Inventors: Fred G. Geil, Annapolis; John H. Thompson, Severna Park, both of Md.

[73] Assignee: Electric Power Research Institute, Inc., Palo Alto, Calif.

[21] Appl. No.: 955,889

[22] Filed: Oct. 30, 1978

[51] Int. Cl.[3] .......................... H03H 9/50; H03H 9/10

[52] U.S. Cl. ...................................... 333/186; 333/187

[58] Field of Search ................................ 333/186-191, 333/197-201, 141; 310/328-332, 341, 349, 15, 17, 19, 337; 29/600, 601

[56] References Cited

U.S. PATENT DOCUMENTS

| | | | |
|---|---|---|---|
| 2,789,557 | 4/1957 | Davis, Jr. | 310/341 X |
| 2,998,536 | 8/1961 | Dubsky et al. | 310/15 |
| 3,168,659 | 2/1965 | Bayre et al. | 310/337 |
| 3,318,152 | 5/1967 | Thompson et al. | 72/362.8 |
| 3,713,035 | 1/1973 | Friedburg et al. | 333/150 |

*Primary Examiner*—Marvin L. Nussbaum

*Attorney, Agent, or Firm*—Flehr, Hohbach, Test

[57] ABSTRACT

Disclosed is a mechanical filter including a resonator mounted within a housing. A first acoustical waveguide extends through a bushing into the housing. Elastomer material fills the bushing and surrounds the first waveguide therein. A compliant member in the form of a bellows having an open end and a closed end is provided in the housing with the open end attached to the housing wall. The first acoustical waveguide is attached to the interior surface of the closed end of bellows, and a second acoustical waveguide is attached to the exterior surface of the closed end of the bellows and to the resonator. The compliant member provides coupling of the first and second waveguides and a hermetic seal.

15 Claims, 3 Drawing Figures

MECHANICAL FILTER AND METHOD OF ACOUSTICALLY COUPLING WAVEGUIDES THEREIN

BACKGROUND OF THE INVENTION

1. Field of the Invention:

This invention relates generally to acoustical resonators, and more particularly the invention relates to housing and acoustical couplers for use with such resonators.

2. Prior Art:

Mechanical or acoustical resonators are well known devices having applications as filters and as temperature sensors, for example. Disclosed in U.S. Pat. No. 3,318,152 issued to Thompson et al is one such temperature sensor.

Particularly in temperature sensing applications, acoustical resonators are placed in environments where hermetic sealing of the resonator is imperative. Copending application Ser. No. 955,634, filed Oct. 30, 1978, now U.S. Pat. No. 4,233,843, discloses a temperature sensing system employing double mode acoustical resonators and which has particular application in sensing the temperature of a high power electrical transformer. In this application the resonator is placed in the oil within the transformer, and temperature of the transformer is determined by measuring the acoustical response of the resonator.

In addition to the need for hermetic sealing of the resonator within a housing, the waveguides which couple acoustical waves to and from the resonator must pass through the resonator housing. Often spurious signals are introduced by coupling between the housing and the waveguide. Additionally, a waveguide which is large enough to present minimum attenuation to acoustical waves will not have the proper source impedance for the resonator, resulting in reflections and poor efficiency unless a suitable transition section is employed.

SUMMARY OF THE INVENTION

An object of this invention is an improved acoustical resonator.

Another object of the invention is improved housing and acoustical coupling means for mechanical resonators.

A feature of the invention is a compliant member which may be in the form of a bellows that joins two waveguide sections and provides a hermetic seal.

Briefly, a resonator is mounted within a housing, and a bushing is attached to the exterior surface of the housing and axially receives a waveguide. Elastometer material is provided within the bushing and surrounds the waveguide to acoustically isolate the waveguide from the housing. A compliant member having an open end and a closed end with a cavity defined therebetween is provided with the housing with the open end of the compliant member attached to the housing wall in cooperation with the bushing. In a preferred embodiment, the compliant member axially receives the waveguide with the end of the waveguide attached to the interior surface at the closed end of the flexible member. A second waveguide is attached to the exterior surface of the closed end of the compliant member whereby acoustical waves are coupled through the compliant member between the two waveguides. The second waveguide provides a transition section between the first waveguide and the housed resonator.

The invention and objects and features thereof will be more fully understood from the following detailed description and appended claims when taken with the drawing.

DESCRIPTION OF THE PREFERRED EMBODIMENT

Figure 1:
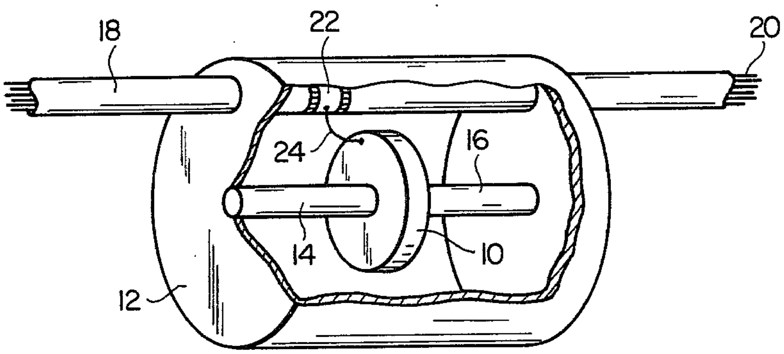
FIG 1 PRIOR ART
FIG. 1 is a perspective view partially in section of a proposed prior art acoustical resonator.

FIG. 1 is a perspective view partially in section illustrating an acoustical resonator and housing which has previously been proposed. The resonator 10 is mounted and hermetically sealed within housing 12 by means of posts of 14, 16. Waveguide 18 comprising a plurality of glass rods 20 extends through housing 12. The glass fibers of the waveguide are connected by epoxy to a glass plate 22 which provides an impedance transition between waveguides. Attached to glass plate 22 is a compliant member 24 such as aluminum wire which couples acoustic waves to resonator 10. While a single waveguide is illustrated, two waveguides can be employed.

While housing 12 does provide a hermetic seal and protection for the resonator 10 mounted herein, some acoustical coupling can exist between transmission line 18 and housing 12 through which it passes.

Figure 2:
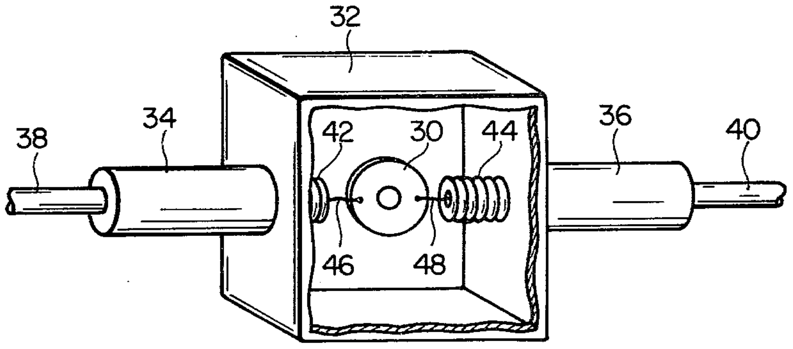
FIG. 2 is a perspective view partially in section of an acoustical resonator in accordance with the present invention.

FIG. 2 is a perspective view partially in section of an acoustical resonator in accordance with one embodiment of the present invention. The resonator 30 is supportably mounted within housing 32 by means of posts, similar to the mounting of resonator 10 within housing 12 in FIG. 1. Physically attached to housing 32 are two guide bushings 34 and 36 which receive waveguides 38 and 40, respectively. The waveguides 38 and 40 extend through the bushings 34, 36 and housing 32 into axially compliant members 42, 44 within housing 32. In this embodiment the compliant members 42, 44 have a bellows configuration with one closed end and an open end which is hermetically attached to the wall of housing 32. Alternatively, the compliant members could be positioned outside of the housing. The bellows is made of metal, rubber, or plastic material. The end of waveguide 38 is attached to the interior surface of the closed end of member 42 by suitable means such as epoxy, and similarly the end of waveguide 40 is attached to the interior surface of the closed end of member 44. Attached to the exterior surface of the closed end of member 42 is a waveguide 46 such as a short length of wire which is attached at the other end to resonator 30. Similarly, a wire waveguide 48 is attached to the exterior surface of member 44 and to resonator 30. In this embodiment waveguide 40 may provide an input of acoustical energy to the resonator, and waveguide 38 may provide an output of acoustical energy from the resonator.

Figure 3:
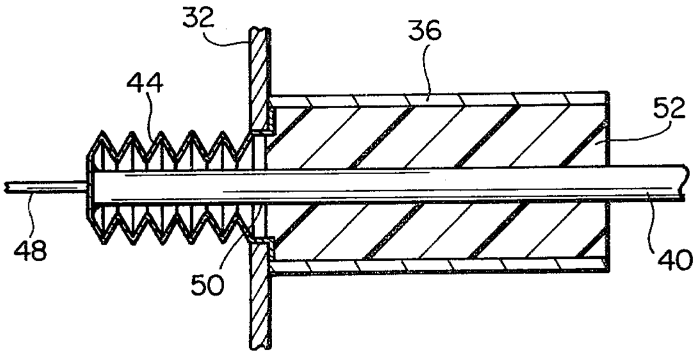
FIG. 3 is a side view in section of a part of the resonator shown in FIG. 2 further illustrating the waveguide transition section of the resonator of FIG. 2.

FIG. 3 is a side view in section further illustrating the mounting of waveguide 40 in bushing 36 and the coupling of waveguide 40 to waveguide 48 by means of axially compliant member 44. As shown, waveguide 40 passes through the bushing 36 and an opening 50 in the wall of housing 32, with an elastomer material 52 filling bushing 36 and providing compliant centering means of waveguide 40 and housing 32. The elastomer may be a suitable plastic material, rubber, or the like.

Compliant member 44 has an open end which is attached to the wall of housing 32 to provide a hermetic seal. The other end of member 44 is closed, and the end of waveguide 40 is attached thereto. Wire 48 is attached to the exterior surface of the closed end of member 44 whereby the axial compliance of member 44 provides coupling of waveguide 40 and wire 48.

The resonator in accordance with the present invention has improved acoustic isolation due to the high flexibility in the axial direction of the waveguides which is provided by the compliant member and also by the elastomer support of the waveguide within the bushing. Further, the compliant member provides hermetic sealing as well as the transmission of longitudinal energy. While the invention has been described with reference to a specific embodiment the description is for illustrative purposes and is not to be construed as limiting the scope of the invention. Various modifications, changes, and applications may occur to those skilled in the art without departing from the true spirit and scope of the invention as defined by the appended claims.

What is claimed is:

1. A mechanical filter comprising a housing having a wall, a mechanical resonator supportably mounted within said housing, a first waveguide, an axially compliant member having an open end and a closed end with said open end attached to said wall, means attaching said first waveguide to the closed end of said compliant member with said first waveguide extending axially through said wall and into said housing and attached to the interior surface of said closed end of said compliant member, and a second waveguide attached to the exterior surface of the closed end of said compliant member and to said resonator whereby mechanical vibrations are coupled from said first waveguide to said second waveguide through the closed end of said compliant member.

2. A mechanical filter as defined by claim 1 wherein said compliant member is expansible along the axis of said first waveguide.

3. A mechanical resonator as defined by claim 1 wherein said compliant member comprises a bellows.

4. A mechanical resonator as defined by claim 3 wherein said first waveguide comprises a glass rod and said second waveguide comprises a metallic whisker.

5. A mechanical resonator as defined by claim 4 and further including bushing means attached to said housing and receiving said first waveguide, and elastomer material within said bushing and surrounding said glass rod.

6. A mechanical filter as defined by claim 1 and further including a bushing member attached to said housing and receiving said first waveguide, and elastomer material within said bushing and surrounding said first waveguide.

7. A mechanical filter as defined by claim 6 and including a third waveguide extending through said wall and into said housing, a second compliant member having an open end and a closed end with said open end attached to said wall of said housing, said second compliant member axially receiving said third waveguide, means attaching said third waveguide to the interior surface of said closed end of said second compliant member, and a fourth waveguide attached to the exterior surface of said closed end of said second flexible member and to said resonator whereby mechanical vibrations are coupled from said fourth waveguide to said third waveguide through said second compliant member.

8. For use in a mechanical resonator within a housing having a first waveguide extending out of said housing and a second waveguide connected to a resonator within said housing, means for coupling said first waveguide to said second waveguide and providing a hermetic seal therebetween comprising a compliant member having an open end and a closed end with a cavity defined therebetween, said open end being attached to said housing with said first waveguide axially extended within said cavity and attached to the interior surface of said closed end, and said second waveguide being attached to the exterior surface of said closed end whereby said first and second waveguides are acoustically coupled through said closed end.

9. Means for coupling a first waveguide to a second waveguide as defined by the claim 8 wherein said compliant member is expansible along the axis of said first waveguide.

10. Means for coupling a first waveguide to a second waveguide as defined by claim 9 wherein said compliant member comprises a bellows.

11. The method of coupling a first waveguide to a second waveguide within a housing comprising the steps of extending said first waveguide into said housing, providing a compliant member having an open end and a closed end with a cavity defined therebetween, attaching the open end of said compliant member to said housing, affixing one end of said first waveguide to the interior surface of said closed end of said compliant member, and attaching a second waveguide to the exterior surface of said closed end of said compliant member, whereby said flexible member provides a hermetic seal for said housing and said closed end acoustically couples said first waveguide and said second waveguide.

12. For use in a mechanical resonator within a housing having a first waveguide outside of said housing and a second waveguide connected to a resonator within said housing, means for coupling said first waveguide to said second waveguide and providing a hermetic seal therebetween comprising a compliant member having an open end and a closed end with a cavity defined therebetween, said open end being attached to said housing with said first waveguide and said second waveguide attached to said closed end of said compliant member whereby said first and second waveguides are acoustically coupled through said closed end.

13. Means for coupling as defined by claim 12 wherein said first waveguide extends axially through said wall and into said housing, said first waveguide is attached to the interior surface of said closed end of said compliant member, and said second waveguide is attached to the exterior surface of said closed end of said compliant member.

14. Means for coupling a first waveguide to a second waveguide as defined by the claim 13 wherein said compliant member is expansible along the axis of said first waveguide.

15. Means for coupling a first waveguide to a second waveguide as defined by claim 14 wherein said compliant member comprises a bellows.

* * * * *